United States Patent
Tangring

(10) Patent No.: US 11,101,402 B2
(45) Date of Patent: Aug. 24, 2021

(54) METHOD OF MANUFACTURING LIGHT EMITTING DIODES AND LIGHT EMITTING DIODE

(71) Applicant: OSRAM Opto Semiconductors GmbH, Regensburg (DE)

(72) Inventor: Ivar Tangring, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 35 days.

(21) Appl. No.: 16/489,678

(22) PCT Filed: Feb. 16, 2018

(86) PCT No.: PCT/EP2018/053912
§ 371 (c)(1),
(2) Date: Aug. 28, 2019

(87) PCT Pub. No.: WO2018/158091
PCT Pub. Date: Sep. 7, 2018

(65) Prior Publication Data
US 2020/0013920 A1    Jan. 9, 2020

(30) Foreign Application Priority Data
Feb. 28, 2017 (DE) .......................... 102017104144.3

(51) Int. Cl.
*H01L 29/18*    (2006.01)
*H01L 33/00*    (2010.01)
(Continued)

(52) U.S. Cl.
CPC ............ *H01L 33/005* (2013.01); *H01L 24/97* (2013.01); *H01L 25/0753* (2013.01);
(Continued)

(58) Field of Classification Search
CPC ... H01L 33/005; H01L 33/60; H01L 25/0753; H01L 24/97; H01L 27/153
See application file for complete search history.

(56) References Cited

U.S. PATENT DOCUMENTS

| | | | |
|---|---|---|---|
| 10,217,913 B2 | 2/2019 | Pindl et al. | |
| 2007/0216297 A1* | 9/2007 | Leng | .................... H01L 33/648 313/512 |

(Continued)

FOREIGN PATENT DOCUMENTS

| | | |
|---|---|---|
| DE | 102012215705 A1 | 3/2014 |
| DE | 102013102482 A1 | 10/2014 |

(Continued)

OTHER PUBLICATIONS

"Specification for White LED," Data Sheet, Nichia Corporation, NVSWE21AT, NICHIA STS-DA1-3822H <Cat. No. 180420>, downloaded from hitp://www.nichia.co.jp/en/product/led_sp_sce17a.html on Sep. 17, 2019, 35 pages.

(Continued)

*Primary Examiner* — Phuc T Dang
(74) *Attorney, Agent, or Firm* — Slater Matsil, LLP

(57) ABSTRACT

A method for manufacturing light emitting diodes and a light emitting diode are disclosed. In an embodiment a method includes providing a light emitting diode chip with a growth substrate and with a semiconductor layer sequence for generating radiation, soldering chip contact surfaces located on a chip underside of the semiconductor layer sequence facing away from the growth substrate to carrier contact surfaces of a carrier, applying a liquid connector transparent to the radiation to a substrate upper side of the growth substrate facing away from the semiconductor layer sequence, fastening a fluorescent body to the substrate upper side, the connector being partially displaced by the fluorescent body from the substrate upper side so that chip side (Continued)

faces are predominantly covered by the connector and generating a reflector on outer faces of the connector facing away from the light emitting diode chip on the chip side faces, the outer faces pointing in a direction away from the carrier.

17 Claims, 2 Drawing Sheets

(51) Int. Cl.
    *H01L 23/00*     (2006.01)
    *H01L 25/075*     (2006.01)
    *H01L 27/15*     (2006.01)
    *H01L 33/60*     (2010.01)

(52) U.S. Cl.
    CPC ............ *H01L 27/153* (2013.01); *H01L 33/60* (2013.01); *H01L 2225/06513* (2013.01)

(56) References Cited

U.S. PATENT DOCUMENTS

| | | | |
|---|---|---|---|
| 2013/0126920 A1* | 5/2013 | Sundgren | H01L 33/30 257/94 |
| 2014/0131753 A1 | 5/2014 | Ishida et al. | |
| 2015/0228873 A1 | 8/2015 | Gebuhr et al. | |
| 2015/0287886 A1* | 10/2015 | Huang | H01L 33/405 257/98 |
| 2016/0013369 A1 | 1/2016 | Schmidtke et al. | |
| 2016/0093780 A1 | 3/2016 | Beppu et al. | |
| 2016/0329468 A1 | 11/2016 | Akram et al. | |
| 2016/0351768 A1 | 12/2016 | Matsuda et al. | |
| 2018/0212128 A1* | 7/2018 | Hayashi | H01L 33/507 |

FOREIGN PATENT DOCUMENTS

| | | |
|---|---|---|
| DE | 102013112549 A1 | 5/2015 |
| JP | 2010219324 A | 9/2010 |
| JP | 2012134355 A | 7/2012 |

OTHER PUBLICATIONS

"High Power LED Series 3535 Ceramic Hot Binning LH331B," Product Family Data Sheet, Rev. 25.2, https://www.samsung.com/led/lighting/high-power-leds/3535-leds/lh351b/#, Mar. 11, 2019, 31 pages.

"Specifications for White LED," Data Sheet, Nichia Corporation, NCSWE17AT, NICHIA STS-DA1-36877J <Cat. No. 180420>, downloaded from http://www.nichia.co.jp/en/product/led_sp_sce17a.html on Sep. 17, 2019, 35 pages.

"Samsung Completes Lineup of High-Power LEDs with LH351C for Outdoor Lighting Applications," downloaded from https://www.samsung.com/led/aboutus/newsevents/news/news-detail-39/ on Sep. 17, 2019, 2 pages.

"Specifications for Warm White LED," Data Sheet, Nichia Corporation, NCSLE17AT, NICHIA STS-DA1-3689L <Cat. No. 180420>, downloaded from http://www.nichia.co.jp/en/product/led_sp_sce17a.html on Sep. 17, 2019, 36 pages.

"Specifications for Warm White LED," Data Sheet, Nichia Corporation, NVSLE21AT, NICHIA STS-DA1-3825J <Cat. No. 180420>, downloaded from http:www.nichia.co.jp/en/product/led_sp_sce17a.html on Sep. 17, 2019, 36 pages.

* cited by examiner

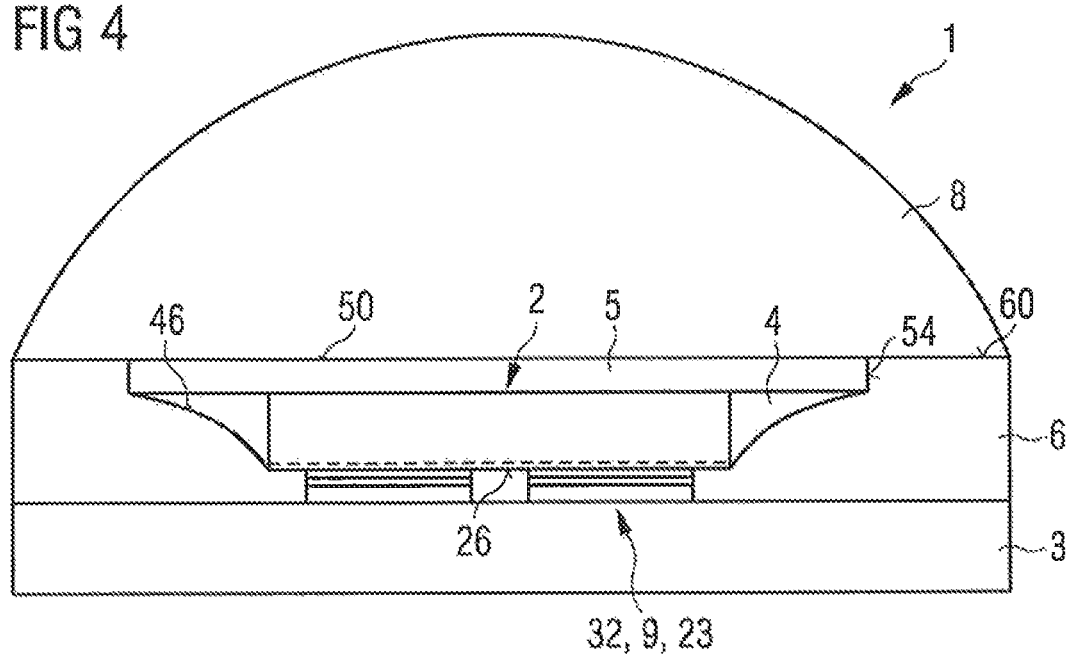
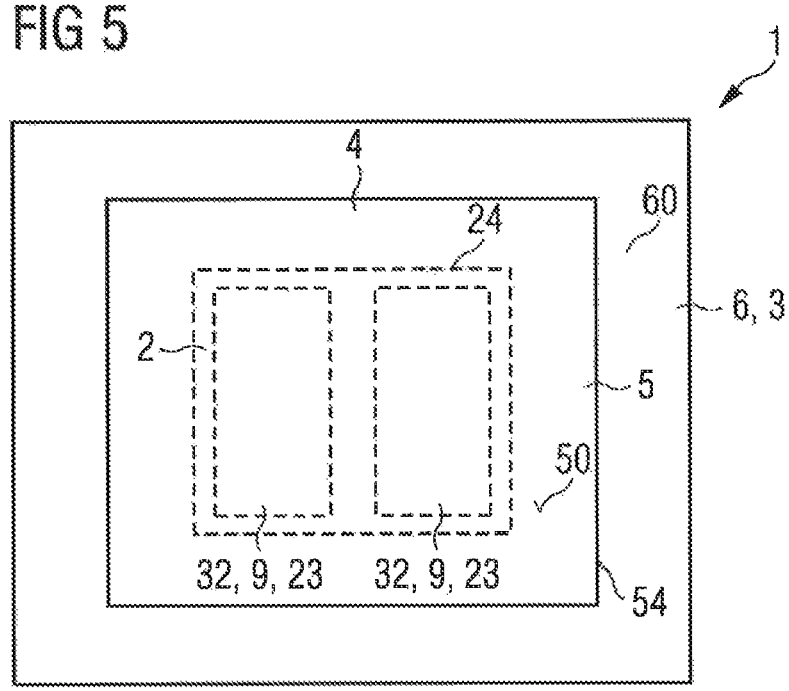

METHOD OF MANUFACTURING LIGHT EMITTING DIODES AND LIGHT EMITTING DIODE

This patent application is a national phase filing under section 371 of PCT/EP2018/053912, filed Feb. 16, 2018, which claims the priority of German patent application 102017104144.3, filed Feb. 28, 2017, each of which is incorporated herein by reference in its entirety.

TECHNICAL FIELD

A method for the manufacture of light emitting diodes is specified. In addition, a light emitting diode is specified.

SUMMARY OF THE INVENTION

Embodiments provide a method by which light emitting diode chips can be attached efficiently while maintaining high light coupling-out efficiency.

According to at least one embodiment, light emitting diodes, or LEDs for short, are produced using this method. During operation, the finished light emitting diodes preferably emit visible light, in particular mixed-colored light such as white light.

According to at least one embodiment, the process comprises the step of providing one or more light emitting diode chips. The at least one light emitting diode chip comprises a semiconductor layer sequence. The semiconductor layer sequence contains an active zone for generating radiation, in particular visible light such as blue light. Furthermore, the light emitting diode chips each comprise a substrate, preferably a growth substrate, on which the semiconductor layer sequence is grown. The substrate is preferably transparent to the radiation to be generated.

The semiconductor layer sequence is preferably based on a III-V compound semiconductor material. The semiconductor material is, for example, a nitride compound semiconductor material such as $Al_nIn_{1-n-m}Ga_mN$ or a phosphide compound semiconductor material such as $Al_nIn_{1-n-m}Ga_mP$ or also an arsenide compound semiconductor material such as $Al_nIn_{1-n-m}Ga_mAs$ or such as $Al_nGa_mIn_{1-n-m}As_kP_{1-k}$, where in each case $0 \leq n \leq 1$, $0 \leq m \leq 1$ and $n+m \leq 1$ and $0 \leq k < 1$ applies. Preferably, $0 < n \leq 0.8$, $0.4 \geq m < 1$ and $n+m \leq 0.95$ and $0 < k \leq 0.5$ apply to at least one layer or to all layers of the semiconductor layer sequence. The semiconductor layer sequence may contain dopants and additional components. For the sake of simplicity, however, only the essential components of the crystal lattice of the semiconductor layer sequence are indicated, i.e., Al, As, Ga, In, N or P, even if these may be partially replaced and/or supplemented by small quantities of other substances.

According to at least one embodiment, a carrier is provided. The carrier is preferably the mechanically stabilizing and supporting component of the finished light emitting diode. For example, the carrier is made of a ceramic material such as aluminum nitride or a semiconductor material such as silicon. Printed circuit boards or metal core boards can also be used as carriers. The finished Light emitting diodes can preferably be electrically and mechanically contacted externally via the carrier.

According to at least one embodiment, the method comprises the step of soldering chip contact surfaces to carrier contact surfaces. The contact surfaces are preferably formed by one or more metallizations on a chip side facing away from the growth substrate and on a main side of the carrier facing the light emitting diode chip. In other words, the chip contact surfaces and the carrier contact surfaces are electrically and mechanically interconnected by soldering, so that the light emitting diode chip is electrically and mechanically attached to the carrier.

According to at least one embodiment, the method comprises the step of applying a connecting means which is transparent to the generated radiation to a substrate upper side of the growth substrate which is remote from the semiconductor layer sequence. When applying, the connecting means is preferably in the liquid state. For example, during application a viscosity of the connecting means is at least 0.2 Pa·s or 1 Pa·s and/or at most 10 Pa·s or 3 Pa·s.

According to at least one embodiment, a fluorescent body is attached to the substrate upper side. Fastening is via the connecting means. In other words, the connecting means is a type of adhesive to which the growth substrate and the fluorescent body are attached.

According to at least one embodiment, the fluorescent body contains one or more phosphors. The at least one phosphor is designed to absorb at least part of the radiation generated in the light emitting diode chips and to convert it into radiation, in particular visible light, of a longer wavelength. The at least one phosphor may be an inorganic phosphor such as YAG:Ce or organic phosphors or so called quantum dot phosphors. In particular, the fluorescent body is designed to partially absorb and convert blue light into green, yellow and/or red light, so that altogether white light is emitted by the finished light emitting diodes.

According to at least one embodiment, when the fluorescent body is attached, the connecting means is partially displaced from the substrate upper side. In other words, so much connecting means is applied that when the fluorescent body is pressed onto the growth substrate, the connecting means intentionally overflows to the side. The overflow of the connecting means preferably takes place only by attaching and/or pressing on the fluorescent body. Before the fluorescent body is applied, the connecting means is preferably limited to the substrate upper side.

According to at least one embodiment, the chip side faces of the light emitting diode chip are predominantly covered by the connector. Predominantly means at least 50% or 90% or 95% or 98%. In particular, the chip side faces are completely covered by the connecting means.

According to at least one embodiment, a reflector is produced. For example, the reflector is designed as a potting body and preferably comprises a matrix material in which reflecting particles are embedded. The reflector is produced on the outer sides of the connecting means facing away from the light emitting diode chip. Thus, the reflector is preferably in direct and full-surface contact with the outer faces of the connecting means.

According to at least one embodiment, the outer faces of the connecting means and thus the corresponding boundary surfaces of the reflector point in a direction away from the carrier. This means that the outer faces are not oriented perpendicular to the carrier, but transversely to the carrier and are arranged to reflect the generated radiation in the direction away from the carrier. For example, the outer faces expand like a funnel in the direction away from the carrier.

In at least one embodiment, the method is configured to produce light emitting diodes and comprises the following steps, preferably in the order given:

A) providing a light emitting diode chip comprising a growth substrate and a semiconductor layer sequence for generating radiation, and providing a carrier having carrier contact surfaces, B) soldering chip contact surfaces, which are located on a chip underside of the semiconductor layer sequence facing away from the growth substrate, to the carrier contact surfaces, C) applying a liquid connecting means transparent to the generated radiation to a substrate upper side of the growth substrate facing away from the semiconductor layer sequence and attaching a fluorescent body to the substrate top surface, the connecting means being partially displaced by the fluorescent body from the substrate top surface, so that chip side faces are predominantly covered by the connecting means, and D) generating a reflector on the outer faces of the connecting means remote from the light emitting diode chip at the chip side faces, wherein the outer sides point in the direction away from the carrier.

The method described here may be used to improve light coupling-out efficiency. In particular, light emitted from the side surfaces of sapphire flip chips can be efficiently radiated in a target-oriented manner. Thin-film soldering may be used to attach the light emitting diode chip. This is achieved in particular by the sequence of the method steps.

Increased light extraction can be achieved by attaching a clear silicone to a sapphire flip chip while it is still mounted on a temporary carrier. Transmissive, groove-shaped fillings of adhesive can also be used for fluorescent bodies if an adequate amount of adhesive is used. However, light emitting diode chips that are coated with an adhesive such as a silicone and/or a fluorescent body cannot be soldered using a heated bond head, for example, as there is a high risk of damaging the adhesive.

In the method described here, the light emitting diode chip is first soldered to the carrier and then the fluorescent body is attached, whereby the fluorescent body is preferably larger than the light emitting diode chip. The connecting means, preferably a silicone, is attached to the chip side faces by exploiting the surface tension, in particular as a groove-shaped filling, while the fluorescent body is attached. The fluorescent body together with a lower edge of the light emitting diode chip serves as a stop edge during wetting with the connecting means.

With the method described here, it is thus possible to attach the light emitting diode chip by means of thin-film soldering, which permits improved thermal contact and more precise positioning. This allows using sapphire flip chips with thin solder contact surfaces without strong radiation absorption near the solder contacts. In addition, pre-sorted fluorescent bodies can be used, for example, because the light emitting diode chips can be electrically operated beforehand, which allows improved color rendering quality to be achieved across a batch. Since the fluorescent body simultaneously acts as a stop edge for the connecting means during wetting to form the filling, this can be produced very reproducibly compared to other methods where a corresponding filling is applied to a large-area intermediate carrier or an unstructured substrate.

According to at least one embodiment, the fluorescent body and/or the carrier protrude laterally, preferably all around, from the light emitting diode chip. The fluorescent body can already be completely structured when it is applied to the substrate upper side, so that subsequent cutting or structuring of the fluorescent body is no longer necessary. After the reflector has been produced, the carrier can be made accessible to a singulation step, so that the carrier and the finished reflector are subsequently divided into individual light emitting diodes by sawing, for example.

According to at least one embodiment, the carrier contact surfaces and the chip contact surfaces remain free of the connecting means. In particular, the connecting means does not get into direct contact with the carrier contact surfaces or the chip contact surfaces.

According to at least one embodiment, the light emitting diode chips are picked up at the top of the substrate by means of a heated bond head, also known as a Heated Bond Head, and soldered in step B). In other words, a placement method is used for the light emitting diode chips, also known as pick-and-place.

According to at least one embodiment, heat for soldering is supplied at least partially through the light emitting diode chips. It is possible that heating of the chip contact surfaces and/or the carrier contact surfaces occurs only through the light emitting diode chips or through the carrier and through the light emitting diode chip as well.

In step B), the placement head preferably has a temperature of at least 200° C. or 250° C. or 280° C., e.g., 300° C. With a heated bond head, efficient and cost-effective placement and soldering of the light emitting diode chips to the carrier is possible. A heated bond head cannot be used if the fluorescent body is already attached to the light emitting diode chip before soldering. On the one hand, the fluorescent body and/or the connecting means could be destroyed in this case, and on the other hand, the fluorescent body and the connecting means would represent a significant additional thermal resistance, so that the temperature of the placement head would have to be increased even further. The use of a heated bond head is enabled in particular by the sequence of the method steps indicated here.

According to at least one embodiment, the chip underside and/or the underside of the fluorescent body facing the carrier each form a stop edge for the connecting means. In other words, an edge is formed between the underside of the fluorescent body and the side surfaces of the fluorescent body, as well as between the chip underside and the chip side faces, and wetting of the underside of the fluorescent body and the chip side faces ends at the respective aforementioned edges due to surface effects. Thus the side surfaces of the fluorescent body as well as the chip underside remain free of the connecting means.

According to at least one embodiment, thin-film soldering is used in step B). This means, for example, that a solder layer between the carrier contact surfaces and the chip contact surfaces has a thickness of at least 0.1 µm or 0.2 µm or 0.5 µm or 1 µm and/or of at most 5 µm or 3 µm or 1.5 µm, in particular immediately before soldering. The solder layer, for example, is formed from a sequence of alternating layers of gold and tin.

According to at least one embodiment, the chip contact surfaces are thin. For example, the chip contact surfaces are thinner than the semiconductor layer sequence, based on an average thickness of the semiconductor layer sequence. For example, a thickness of the chip contact surfaces is at least 0.3 µm or 0.5 µm and/or at most 5 µm or 3 µm or 1.5 µm.

According to at least one embodiment, the carrier contact surfaces are thick. In particular, a thickness of the carrier contact surfaces is greater than the average thickness of the semiconductor layer sequence. Preferably, the carrier contact surfaces are at least 30 µm or 50 µm thick and/or at most 0.3 mm or 0.1 mm or 70 µm.

According to at least one embodiment, in step B) a soldering temperature on the light emitting diode chip, in particular on the growth substrate and on the semiconductor layer sequence as well as on the chip contact surfaces, is at least 220° C. or 250° C. or 280° C. It is possible that the soldering temperature may be above a destruction temperature or degeneration temperature of the connecting means used later. In other words, the connecting means and optionally also the fluorescent body are not temperature-resistant at the soldering temperature.

According to at least one embodiment, the connecting means is a silicone. A connecting means with a high optical refractive index is preferred. In particular, the refractive index is at least 1.46 or 1.50, based on a temperature of 300 K and a wavelength of maximum intensity of the radiation generated by the light emitting diode chips during operation.

According to at least one embodiment, the compound is a phenyl silicone. A percentage by weight of the phenyl in the silicone as a whole is preferably at least 2% or 5% or 10% or 15%.

According to at least one embodiment, the reflector is produced by dispensing in step D). This means that a material for the reflector is essentially applied without pressure in the liquid state. When applied, for example, the material for the reflector has a viscosity of at least 0.5 Pa·s or 2 Pa·s and/or at most 50 Pa·s or 15 Pa·s. The shape of the reflector is created primarily by surface effects and surface tension, so that no casting mold, also known as mold, is required.

According to at least one embodiment, the reflector is flush with a light exit side of the fluorescent body facing away from the carrier. This applies in particular with a tolerance of at most 5 µm or 2 µm. An upper side of the reflector facing away from the carrier and the light emitting side may lie in a common plane.

According to at least one embodiment, the radiation generated by the finished light emitting diodes during operation is emitted from the reflector and/or from the finished light emitting diodes exclusively at the light exit side. In particular, no radiation is emitted from the side surfaces of the fluorescent body or through other parts of the reflector.

According to at least one embodiment, the material of the reflector extends between the chip contact surfaces on the chip underside and/or between an area between the carrier and the chip underside. It is possible that the area between the chip underside and the carrier is completely filled by the material of the reflector.

According to at least one embodiment, the light emitting diode chip is a sapphire flip chip. The light emitting diode chip is designed to generate blue light, for example, with a wavelength of maximum intensity of at least 425 nm and/or at most 480 nm. The growth substrate is a sapphire substrate. The semiconductor layer sequence is based on the AlInGaN material system.

According to at least one embodiment, the fluorescent body is self-supporting in step C). This means that the fluorescent body does not need any further support like a carrier substrate. Alternatively, the fluorescent body is composed of a carrier substrate and at least one fluorescent layer. The carrier substrate is preferably located on a side of the fluorescent body facing away from the growth substrate. The fluorescent body may have one or more layers which are mixed with different phosphors. For example, there is one layer for generating yellow or green-yellow light and another layer for generating red light, which is located closer to the light emitting diode chip. The fluorescent body may be a ceramic plate, a glass plate or a silicone plate, in the case of a silicone plate preferably connected to a glass carrier substrate. Such glass plates may be produced by a sol-gel method.

According to at least one embodiment, the fluorescent body is covered by a lens after step D). The lens may be in direct contact with the fluorescent body. The lens is produced, for example, by compression molding or dripping or can also be glued on. The lens can be limited to the fluorescent body and thus to the light exit side or alternatively extend onto the reflector. It is possible that the entire reflector is covered by the lens.

In addition, a light emitting diode is specified. The light emitting diode is preferably manufactured using a method as described in conjunction with one or more of the above embodiments. Characteristics of the method are therefore also disclosed for the light emitting diode and vice versa.

In at least one embodiment of the light emitting diode, the light emitting diode chip is mounted on the carrier and fastened by means of a solder layer. The fluorescent body is fastened via the connecting means. The connecting means forms a preferably groove-shaped filling on the chip side faces, which widens in the direction away from the carrier, so that in interaction with the approximately white appearing reflector on the outer faces of the connecting means a light guidance results in the direction away from the carrier.

BRIEF DESCRIPTION OF THE DRAWINGS

In the following, a method described here and a light emitting diode described here are explained in more detail with reference to the drawing using exemplary embodiments. The same reference signs indicate the same elements in the individual figures. However, no true-to-scale references are shown; rather, individual elements may be exaggeratedly large for a better understanding.

In the Figures:

FIGS. 1 to 4 show schematic sectional views of method steps of a method for the production of an exemplary embodiment of a light emitting diode; and FIG. 5 shows a schematic top view of an exemplary embodiment of a light emitting diode.

DETAILED DESCRIPTION OF ILLUSTRATIVE EMBODIMENTS

Figure 1:
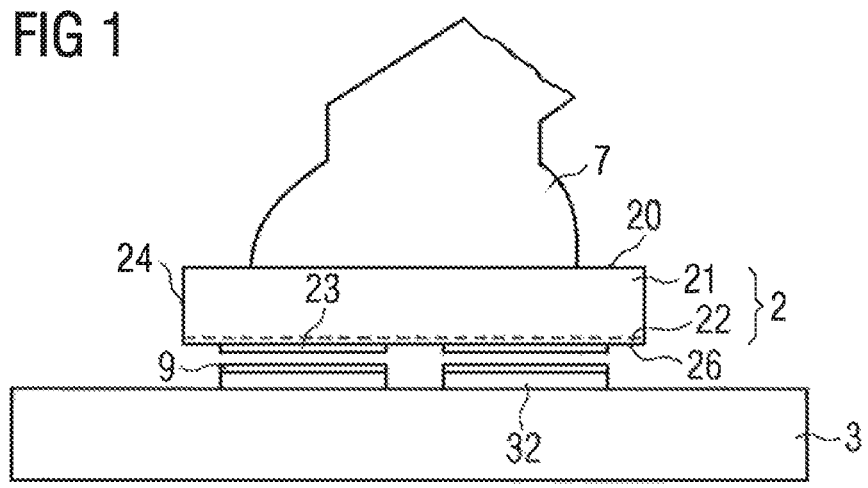

FIGS. 1 to 4 describe a manufacturing method for light emitting diodes 1. According to FIG. 1 a carrier 3 and a light emitting diode chip 2 are provided. The carrier 3 has several carrier contact surfaces 32 on one main side. The carrier contact surfaces 32 are comparatively thick, for example, at least 50 µm and at most 100 µm thick. The carrier contact surfaces 32 are formed by one or more metallizations. The carrier 3 further preferably comprises non-drawn electrical conductors and/or vias as well as external mounting surfaces. Carrier 3 may be from aluminum nitride.

The light emitting diode chip 2 comprises a growth substrate 21, e.g., sapphire. The growth substrate 21 has a semiconductor layer sequence 22, especially from AlInGaN. Chip contact surfaces 23 are attached to the semiconductor layer sequence 22 and facing the carrier 3, the semiconductor layer sequence 22 being electrically contacted via the chip contact surfaces 23. The chip contact surfaces 23 are only thin, for example, between 1 µm and 1.5 µm thick. Contrary to the illustration in FIG. 1, a thickness of the chip contact surfaces 23 is preferably below a thickness of the semiconductor layer sequence 22. Thus, all chip contact surfaces 23 are located on a chip underside 26 facing the carrier 3. A substrate upper side 20 is opposite the chip underside 26. A thickness of the light emitting diode chip 2, for example, is at least 100 µm or 150 µm and/or at most 350 µm or 250 µm.

A solder layer 9 is provided on the carrier contact surfaces 32. For example, this is an AuSn solder layer. Solder layer 9 is designed for thin-film soldering and, for example, has a thickness of 1 µm to 2 µm. Alternatively, solder layer 9 may be provided on the chip contact surfaces 23.

According to FIG. 1, the light emitting diode chip 2 is held on the substrate upper side 20 by means of a heated bond head 7, also known as the Heated Bond Head, for example, by vacuum. The light emitting diode chip 2 is heated at the same time. The light emitting diode chip 2 is then positioned in such a way that the chip contact surfaces 23 are opposite the carrier contact surfaces 32. The light emitting diode chip 2 is soldered to the carrier 3 by means of a temperature supply via the heated bond head 7 and optionally via the carrier 3.

Figure 2:
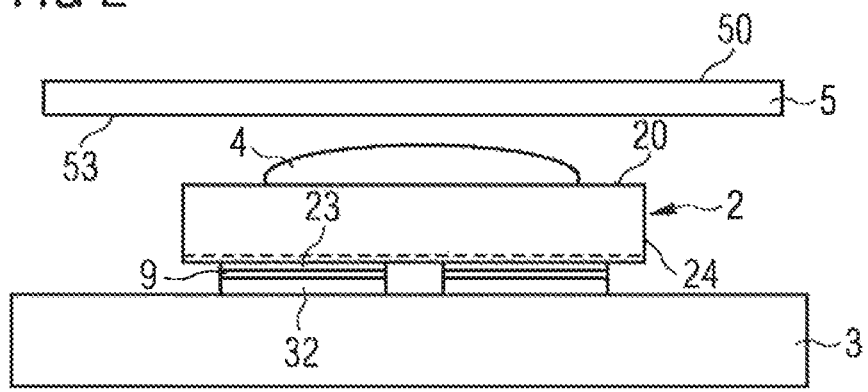

In FIG. 2 the soldered semiconductor chip 2 is shown. Subsequently, a liquid connection means 4 is applied to the substrate upper side 20. The connecting means 4, preferably a phenyl silicone, remains limited to the substrate upper side 20.

In the following, see FIGS. 2 and 3, a fluorescent body 5 is pressed onto the substrate upper side 20 and thus the connecting means 4 is pressed on. The connecting means 4 thus passes over the substrate upper side 20 in a targeted manner and wets chip side faces 24 as well as an underside 53 of the fluorescent body 5 facing the carrier 3. As a result, a groove-shaped filling of the radiolucent connecting means 4 forms all the way around the light emitting diode chip 2.

The chip underside 26 as well as the side surfaces 54 of the fluorescent body 5 remain free of the connecting means 4. A distance between the growth substrate 21 and the fluorescent body 5 is preferably not more than 5 µm or 2 µm, corresponding to a thickness of the connecting means 4 on the substrate upper side 20. The fluorescent body 5 can be a ceramic plate containing one or more phosphors.

Figure 3:
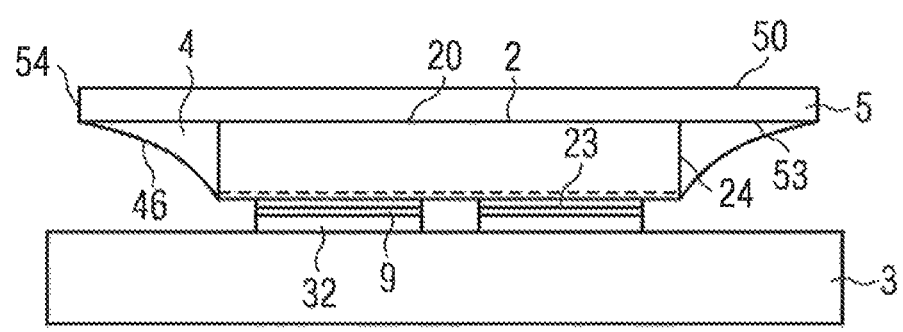

According to FIG. 3, the connecting means 4 is concavely shaped over the chip side faces 24. Deviating from this, the connecting means 4 can also be convex or be shaped like triangle when viewed in cross-section. An average angle from outer faces 46 of connecting means 4 to chip side faces 24 is preferably at least 45° or 50° and/or at most 70° or 65°, preferably at about 60°. In particular, it is possible that all parts of the outer face 46 include an angle of at least 30° and/or at most 75° to the chip side faces 24. The thin layer of connecting means 4 remaining on the substrate upper side 20 is not drawn in the figures to simplify the representation.

FIG. 4 illustrates that a reflector 6 is generated in particular by dispensing. A top 60 of the reflector 6 facing away from the support 3 is flush with a light exit side 50 of the fluorescent body 5 and lies in a common plane with it. The outer faces 46 of the connecting means 4 are completely covered by a material of the reflector 6. An area between the carrier 3 and the chip underside 26 is preferably completely filled by the material of the reflector 6. The large thickness of the carrier contact surfaces 32 ensures that no radiation reaches the carrier 3 through the material of the reflector 6. The material of reflector 6, for example, is a silicone filled with titanium dioxide particles. Preferably the reflector 6 reflects diffusely and/or appears white, as is possible in all other exemplary embodiments.

Furthermore, the side surfaces 54 of the fluorescent body 5, which are oriented transversely, in particular vertically or approximately perpendicularly to the light exit side 50, are completely covered by the material of the reflector 6. A thickness of reflector 6 in the direction perpendicular to the side surfaces 54 is preferably at least 50 µm or 100 µm. This prevents radiation from escaping from the side surfaces 54.

Thus, radiation emerges from the reflector 6 through the fluorescent body 5 on the light exit side 50 only. The radiation exit side 50 can be oriented parallel or approximately parallel to the main side of the carrier 3 facing the light emitting diode chip 2.

Optionally, it is possible, as in all other exemplary embodiments, to have a lens 8. The lens 8 is designed as a rotationally symmetrical collecting lens and preferably completely covers the light exit side 50. Deviating from the illustration in FIG. 4, it is possible that the lens 8 does not cover the reflector 6, but is limited to the light exit side 50.

Further method steps such as the separation of a carrier composite to the individual light emitting diodes 1 are not illustrated.

In FIG. 5 it is shown that the reflector 6 runs around the fluorescent body 5 and the fluorescent body 5 runs around the light emitting diode chip 2, the latter preferably with a constant, invariant width. The connecting means 4 is attached congruently to the fluorescent body 5. The contact surfaces 23, 32 and solder layer 9 cover a large part of the chip underside 26 of the light emitting diode chip 2.

Unless otherwise indicated, the components shown in the figures follow each other directly in the order indicated. Layers not touching each other in the figures are spaced from each other. If lines are drawn parallel to each other, the corresponding surfaces are also aligned parallel to each other. Also, unless otherwise indicated, the relative thickness ratios, length ratios and positions of the drawn components to each other are correctly reproduced in the figures.

The invention described here is not limited by the description given by way of the exemplary embodiments. Rather, the invention includes each new feature as well as each combination of features, which in particular includes each combination of features in the patent claims, even if that feature or combination itself is not explicitly stated in the patent claims or exemplary embodiments.

The invention claimed is:

1. A method comprising:
   providing a light emitting diode chip with a growth substrate and a semiconductor layer sequence for generating radiation;
   soldering chip contact surfaces located on a chip underside of the semiconductor layer sequence facing away from the growth substrate to carrier contact surfaces of a carrier;
   applying a liquid connector transparent to the radiation to a substrate upper side of the growth substrate facing away from the semiconductor layer sequence;
   fastening a fluorescent body to the substrate upper side, the liquid connector being partially displaced by the fluorescent body from the substrate upper side so that chip side faces are predominantly covered by the liquid connector; and
   generating a reflector on outer faces of the liquid connector facing away from the light emitting diode chip on the chip side faces, the outer faces pointing in a direction away from the carrier,
   wherein the chip underside and an underside of the fluorescent body facing the carrier each represents a stop edge for the liquid connector so that the chip underside and side surfaces of the fluorescent body remain free of the liquid connector.

2. The method according to claim 1, wherein the fluorescent body and the carrier laterally project beyond the light emitting diode chip all around, and wherein the carrier contact surfaces and the chip contact surfaces remain free of the liquid connector and at least 95% of the chip side faces are covered by the liquid connector.

3. The method according to claim 1, wherein the light emitting diode chips are picked by a heated bond head on the substrate upper side and are soldered so that a heat supply for soldering takes place through the light emitting diode chips.

4. The method according to claim 1, wherein soldering comprises thin film soldering forming a solder layer between the carrier contact surfaces and the chip contact surfaces, wherein the solder layer has a thickness between 0.5 µm and 3 µm inclusive immediately prior of the soldering, the chip contact surfaces have a thickness between 0.3 µm and 3 µm inclusive and the carrier contact surfaces have a thickness between 30 µm and 0.3 mm inclusive.

5. The method according to claim 1, wherein soldering comprises providing a temporary soldering temperature on the light emitting diode chip of at least 280° C.

6. The method according to claim 5, wherein the liquid connector is not temperature-resistant at the temporary soldering temperature.

7. The method according to claim 1, wherein the liquid connector is a silicone having a refractive index of at least 1.46 and having a phenyl content of at least 10% by weight.

8. The method according to claim 1, wherein the reflector is formed by a potting body produced by dispensing, wherein the reflector is flush with a light exit side of the fluorescent body facing away from the carrier so that the radiation generated during operation of the finished light emitting diodes is radiated only at the light exit side.

9. The method according to claim 1, wherein a material of the reflector extends between the chip contact surfaces at the chip underside so that a region between the chip underside and the carrier is at least partially filled by the material.

10. The method according to claim 1, wherein the light emitting diode chip is a sapphire flip chip for generating blue light such that the growth substrate is of sapphire and the semiconductor layer sequence is of AlInGaN.

11. The method according to claim 1, wherein the fluorescent body is self-supporting and is a ceramic plate, a silicone plate or a glass plate.

12. The method according to claim 1, further comprising covering the fluorescent body by a lens directly after generating the reflector.

13. A light emitting diode comprising:
at least one light emitting diode chip comprising a growth substrate and a semiconductor layer sequence configured to generate radiation;
a carrier with carrier contact surfaces;
a solder layer with a thickness of at most 3 µm located between chip contact surfaces located on a chip underside of the semiconductor layer sequence facing away from the growth substrate and the carrier contact surfaces;
a connector configured to be transmissive to the radiation, the connector being located on a substrate upper side of the growth substrate facing away from the semiconductor layer sequence and on chip side faces of the light emitting diode chip;
a fluorescent body located on the substrate upper side fixed by the connector; and
a reflector located on outer faces of the connector facing away from the light emitting diode chip over the chip side faces,
wherein the fluorescent body and the carrier project laterally beyond the light emitting diode chip all around,
wherein the chip side faces are at least 95% covered by the connector,
wherein the chip underside and an underside of the fluorescent body facing the carrier each represents a stop edge for the connector so that the chip underside and side surfaces of the fluorescent body remain free of the connector and the connector widens at the chip side faces in a direction away from the carrier.

14. The light emitting diode according to claim 13, wherein the chip side faces do not overlap with the carrier contact surfaces in top view.

15. The light emitting diode according to claim 13, wherein a vertical extent of the reflector increases with increasing distance from the at least one light emitting diode chip.

16. The light emitting diode according to claim 13, wherein the connector is a silicone having a refractive index of at least 1.46 and having a phenyl content of at least 10% by weight.

17. A method comprising:
providing a light emitting diode chip with a growth substrate and a semiconductor layer sequence for generating radiation;
soldering chip contact surfaces located on a chip underside of the semiconductor layer sequence facing away from the growth substrate to carrier contact surfaces of a carrier;
applying a liquid connector which is transparent to the radiation to a substrate upper side of the growth substrate which faces away from the semiconductor layer sequence;
fastening a fluorescent body to the substrate upper side, the liquid connector being partially displaced by the fluorescent body from the substrate upper side so that chip side faces are at least 95% covered by the liquid connector; and
generating a reflector on outer faces of the liquid connector facing away from the light emitting diode chip on the chip side faces, the outer faces pointing in a direction away from the carrier,
wherein the chip underside and an underside of the fluorescent body facing the carrier each represents a stop edge for the liquid connector so that the chip underside and side surfaces of the fluorescent body remain free of the liquid connector and the liquid connector widens at the chip side faces in a direction away from the carrier,
wherein each light emitting diode chip is picked by a heated bond head on the substrate upper side and is soldered so that a heat supply for the soldering takes place through the light emitting diode chip,
wherein soldering comprises thin film soldering forming a solder layer between the carrier contact surfaces and the chip contact surfaces immediately prior the soldering, and
wherein the solder layer has a thickness of at most 3 µm.

* * * * *